(12) United States Patent
Yoon et al.

(10) Patent No.: US 6,768,199 B2
(45) Date of Patent: Jul. 27, 2004

(54) FLIP CHIP TYPE SEMICONDUCTOR DEVICE AND METHOD OF FABRICATING THE SAME

(75) Inventors: Jung-Lim Yoon, Seoul (KR); Jong-Hyon Ahn, Suwon (KR); Chang-Hun Lee, Ahnsan-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/974,025

(22) Filed: Oct. 10, 2001

(65) Prior Publication Data

US 2002/0149105 A1 Oct. 17, 2002

(30) Foreign Application Priority Data

Apr. 11, 2001 (KR) .................................. 20 2001-19307

(51) Int. Cl.[7] .......................... H01L 23/48; H01L 23/52; H01L 29/40
(52) U.S. Cl. ........................ 257/758; 257/786; 257/778; 257/737; 257/762; 257/529
(58) Field of Search ................................ 257/758, 786, 257/778, 737, 762, 529; 438/132, 601

(56) References Cited

U.S. PATENT DOCUMENTS

| 5,985,765 A | * | 11/1999 | Hsiao et al. | ................. 438/694 |
| 6,440,833 B1 | * | 8/2002 | Lee et al. | .................... 438/601 |
| 6,451,681 B1 | * | 9/2002 | Greer | ......................... 438/601 |
| 6,649,997 B2 | * | 11/2003 | Koike | ......................... 257/529 |

\* cited by examiner

*Primary Examiner*—Eddie Lee
*Assistant Examiner*—Nitin Parekh
(74) *Attorney, Agent, or Firm*—Mills & Onello, LLP

(57) ABSTRACT

A flip chip type semiconductor device comprises at least one first metal line and at least a pair of second metal lines formed in the passivation layer, an aluminum pad covering the first metal line, an aluminum fuse covering the pair of second metal lines adjacent to each other and the passivation layer therebetween, and an under-bump metal layer pattern and a bump formed on the aluminum pad in order. The first and second metal lines are formed respectively in first and second grooves by using a damascene process after forming first and second grooves in the passivation layer.

5 Claims, 6 Drawing Sheets

FLIP CHIP TYPE SEMICONDUCTOR DEVICE AND METHOD OF FABRICATING THE SAME

This application relies for priority upon Korean Patent Application No.2001-19307, filed on Apr. 11, 2001, the contents of which are herein incorporated by reference in their entirety.

FIELD OF THE INVENTION

The present invention relates to a semiconductor device and method of fabricating the same, and more particularly to a flip chip type semiconductor device and method of fabricating the same.

BACKGROUND OF THE INVENTION

Semiconductor devices are generally sealed through a packaging process to protect them from the external environment. In the package process, a pad of the semiconductor device is connected to a lead of a lead frame by means of a bonding wire. However, there is a limit in improving reliability and electrical characteristics of the semiconductor device. Accordingly, in recent years, a flip chip package process is widely used in the fabrication of high performance semiconductor devices.

FIG. 1 is a cross-sectional view illustrating a conventional method of fabricating a flip chip type semiconductor device. In the drawing, the portions indicated by reference signs "a" and "b" represent pad and fuse areas, respectively.

Referring to FIG. 1, an interlayer insulation layer 3 is formed on a surface of a semiconductor substrate 1. The interlayer insulation layer 3 is then patterned to form via holes (not shown) which pass through a given region thereof Over the whole surface of the substrate 1 on which the via holes are formed, a final interlayer insulation layer 5 is formed. The final interlayer insulation layer 5 is then patterned to form at least one first groove and at least one second groove in the pad and fuse areas a, b, respectively. In the first and second grooves, first and second metal lines 10a, 10b are formed by means of a damascene process. The second metal line 10b corresponds to a fuse. The first and second metal lines 10a, 10b comprise a copper layer pattern 9 having superior conductivity and electromigration as compared with an aluminum layer, and a diffusion barrier metal layer pattern 7 enclosing side walls and bottoms of the copper layer pattern 9.

Over the whole surface of the substrate including the first and second metal lines 10a, 10b, a passivation layer 18 is formed. The passivation layer 18 is formed by depositing a lower silicon nitride layer 13, an intermediate silicon oxide layer 15 and an upper silicon nitride layer 17 in order. The lower silicon nitride layer 13 functions as a diffusion barrier layer for preventing copper elements in the copper layer pattern 9 from penetrating through the final interlayer insulation layer 5. Then, the passivation layer 18 is patterned to form a pad contact hole exposing the first metal line 10a. Over the whole surface of the substrate over which the pad contact hole is formed, a barrier metal layer and a pad metal layer are sequentially formed. And then, the pad metal layer and the barrier metal layer are continuously patterned to form a pad 24 covering the pad contact hole. The pad 24 comprises a barrier metal layer pattern 21 and a pad metal layer pattern 23 which are sequentially stacked.

Subsequently, the upper silicon nitride layer 17 is patterned to form an opening 27 on the fuse, i.e., the upper part of the second metal line 10b. After a polyimide layer 29 is formed over the whole surface of the substrate over which the opening 27 is formed, the polyimide layer 29 is patterned. As a result, a pad opening exposing the pad 24 and a fuse opening 31 exposing the silicon oxide layer 15 on the second metal line 10b are formed. On the exposed pad 24, an under-bump metal layer pattern 33 and a bump 35 are formed.

As described above, according to the conventional method, a back-end process is complicated. Also, since the cooper layer pattern is used as the fuse, it is difficult to cut the fuse using a laser during a repair process.

SUMMARY OF THE INVENTION

Therefore, it is an object of the present invention to provide an improved method of fabricating a flip chip type semiconductor device which can simplify a back-end process and form a fuse with a material that is easy to cut using a laser.

It is another object of the present invention to provide an improved flip chip type semiconductor device which is fabricated by the improved method described above.

These and other objects are provided, according to an aspect of the present invention, by a method of fabricating a flip chip type semiconductor device having pad and fuse areas. The method of the invention comprises forming an interlayer insulation layer and a passivation layer in order on a semiconductor substrate and forming at least one first metal line and at least a pair of second metal lines in the passivation layer. The first metal line is formed in the pad area, and the second metal lines are formed in the fuse area. Over the surface of the substrate including the first and second metal lines, a metal layer is formed. The metal layer is patterned so as to form a pad covering a portion of the first metal line and a fuse covering the pair of the second metal lines and the passivation layer therebetween. Consequently, the fuse is formed of the same material metal layer as the pad, and the pair of second metal lines are electrically interconnected to each other. Subsequently, a polyimide layer is formed over the whole surface of the substrate including the pad and the fuse. The polyimide layer has a pad opening exposing the pad. On the exposed pad, an under-bump metal layer pattern and a bump are formed.

Another aspect of the present invention may be provided by a flip chip type semiconductor device having pad and fuse areas. The flip chip type semiconductor device comprises an interlayer insulation layer formed on a semiconductor substrate and a passivation layer formed on the interlayer insulation layer. In the passivation layer, at least one first metal line and at least a pair of second metal lines are disposed. The first metal line is disposed in the pad area, and the second metal lines are disposed in the fuse area. A given portion of the first metal line is covered with a pad, and the pair of second metal lines adjacent to each other and the passivation layer therebetween are covered with a fuse. The fuse and the pad are formed of the same material layer. A polyimide layer covers the surface of the semiconductor substrate including the pad and fuse. The polyimide layer has a pad opening exposing the pad. On the exposed pad, an under-bump metal layer pattern and a bump are disposed in order.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention now will be described more fully hereinafter with reference to the accompanying drawings, in which a preferred embodiment of the invention is shown. This invention may, however, be embodied in many different forms and should not be construed as limited to the embodiment set forth herein.

Figure 1:
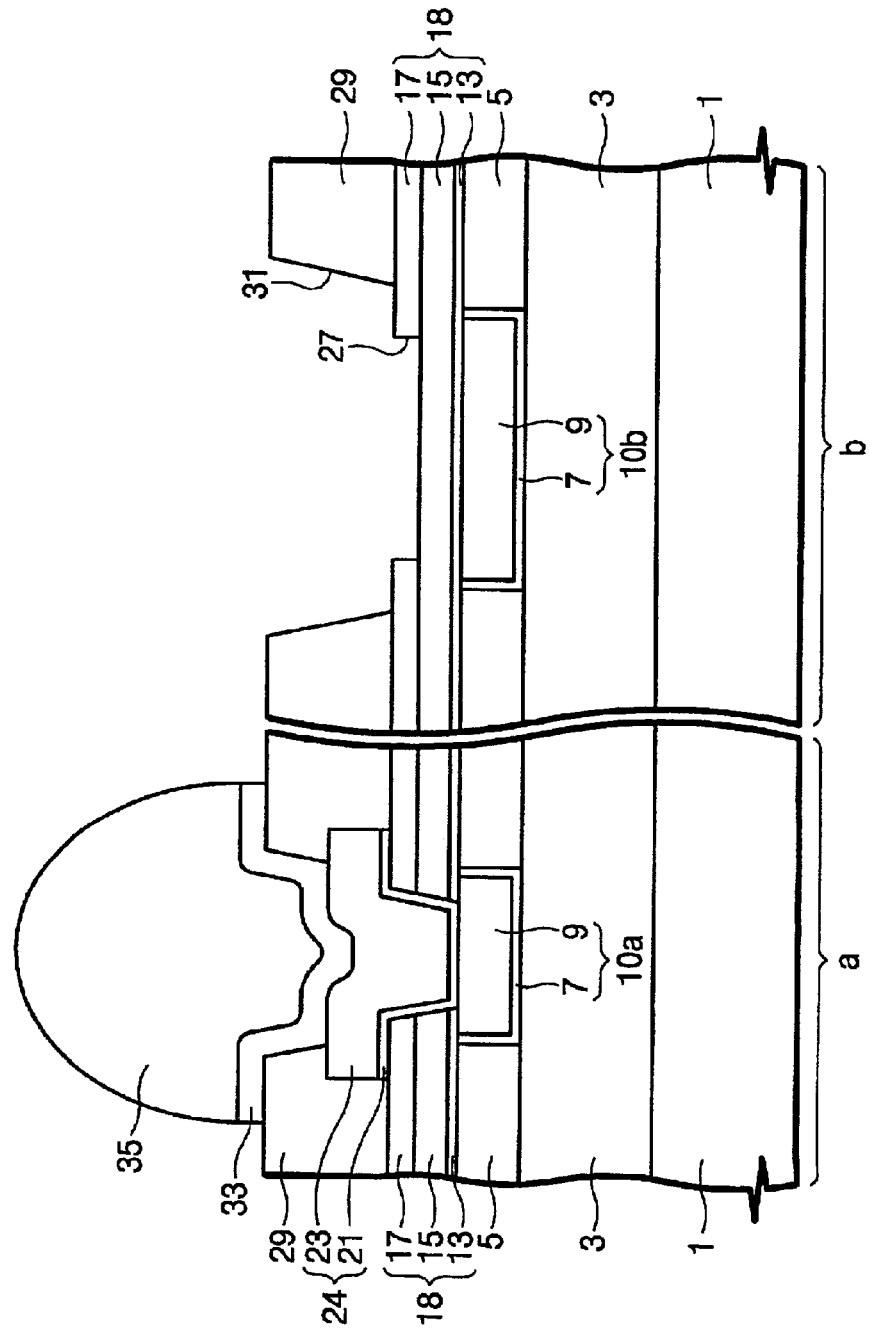
FIG. 1 is a cross-sectional view illustrating a conventional method of fabricating a flip chip type semiconductor device.
Figure 2:
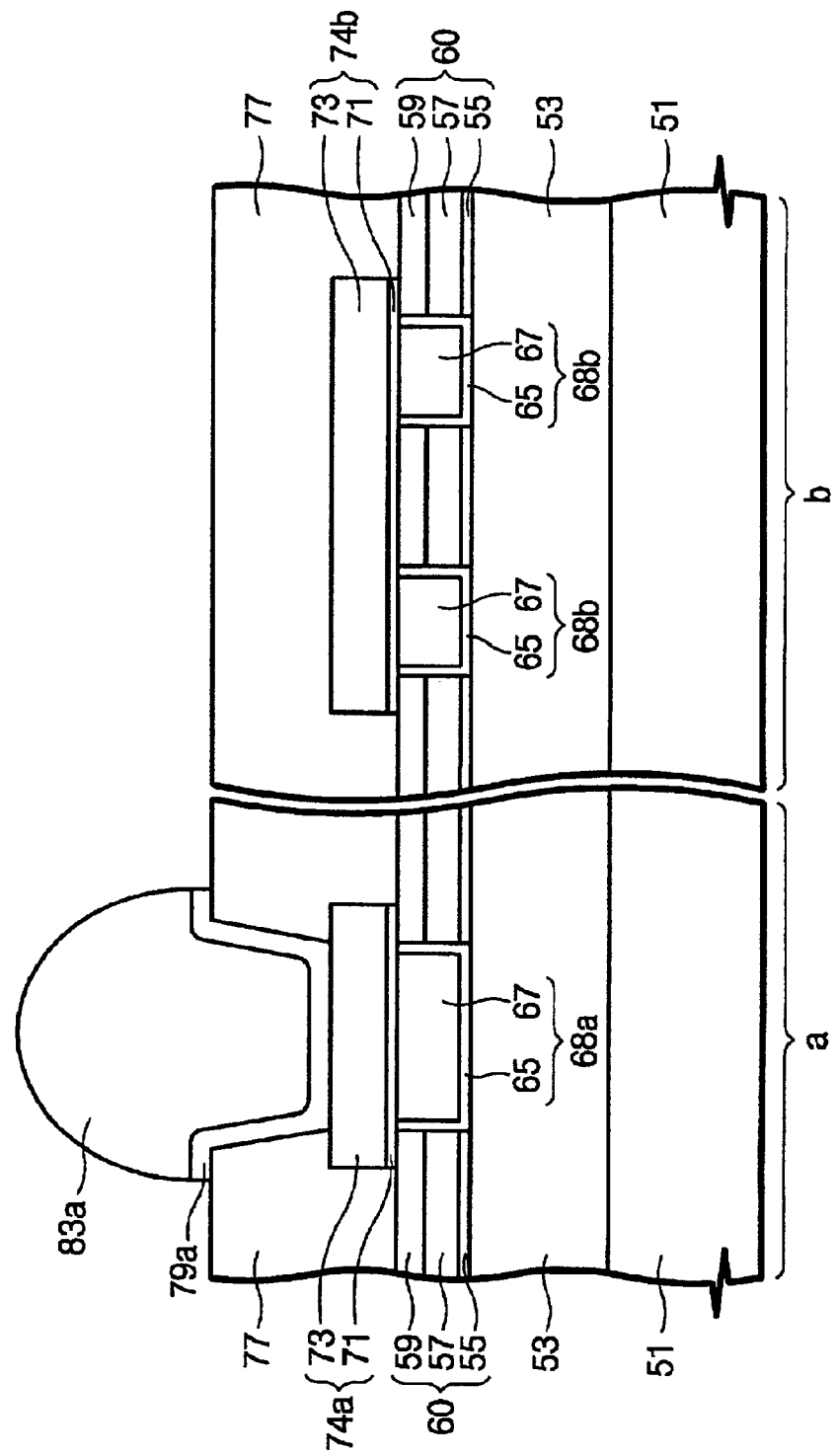
FIG. 2 is a cross-sectional view of a flip chip type semiconductor device in accordance with the present invention.

FIG. 2 is a cross-sectional view of a flip chip type semiconductor device in accordance with the present invention. In the drawing, the portions indicated by reference signs "a" and "b" represent pad and fuse areas, respectively.

Referring to FIG. 2, a semiconductor substrate 51 is covered with an interlayer insulation layer 53. The interlayer insulation layer 53 is a material layer such as a silicon oxide layer containing impurities, or an undoped silicon oxide layer, which corresponds to a final interlayer insulation layer. On the interlayer insulation layer 53, a passivation layer 60 is disposed. The passivation layer 60 comprises a lower silicon nitride layer 55, an intermediate silicon oxide layer 57 and an upper silicon nitride layer 59 which are deposited in order. Alternatively, the passivation layer 60 can comprise a lower silicon oxide layer 57 and an upper silicon nitride layer 59 which are deposited in order.

In the passivation layer 60 of the pad area, at least one first metal line 68a is disposed, and in the passivation layer 60 of the fuse area b, a plurality of, for example at least a pair of, second metal lines 68b are disposed. Top surfaces of the first and second metal lines 68a, 68b have the same height as a top surface of the passivation layer 60. The first and second metal lines 68a, 68b include a copper layer pattern 67 having superior conductivity and electromigration as compared with an aluminum layer, and a diffusion barrier metal layer pattern 65 enclosing side walls and bottoms of the copper layer pattern 67. It is desirable that the diffusion barrier metal layer pattern 65 include a material layer, for example a tantalum nitride layer which can prevent copper elements in the copper layer pattern 67 from penetrating through the interlayer insulation layer 53 and the passivation layer 60.

A portion of the first metal line 68a is covered with a pad 74a. Also, in the fuse area b, a fuse 74b is disposed. The fuse 74b covers a pair of second metal lines 68b adjacent to each other, and a portion of the passivation layer 60 therebetween. Consequently, the fuse 74b electrically interconnects the pair of second metal lines 68b adjacent to each other. The pad 74a and the fuse 74b comprise a barrier metal layer pattern 71 and an aluminum layer pattern 73 which are deposited in order. The barrier metal layer pattern 71 is desirably composed of a tantalum nitride layer.

The semiconductor substrate including the pad 74a and the fuse 74b is covered with a polyimide layer 77. The polyimide layer 77 has a pad opening exposing the pad 74a. On the pad 74a exposed by the pad opening, an under-bump metal layer pattern 79a and a bump 83a are disposed in order.

The method of fabricating the flip chip type semiconductor device shown in FIG. 2 will now be described with reference to FIG. 3 to FIG. 6.

Figure 3:
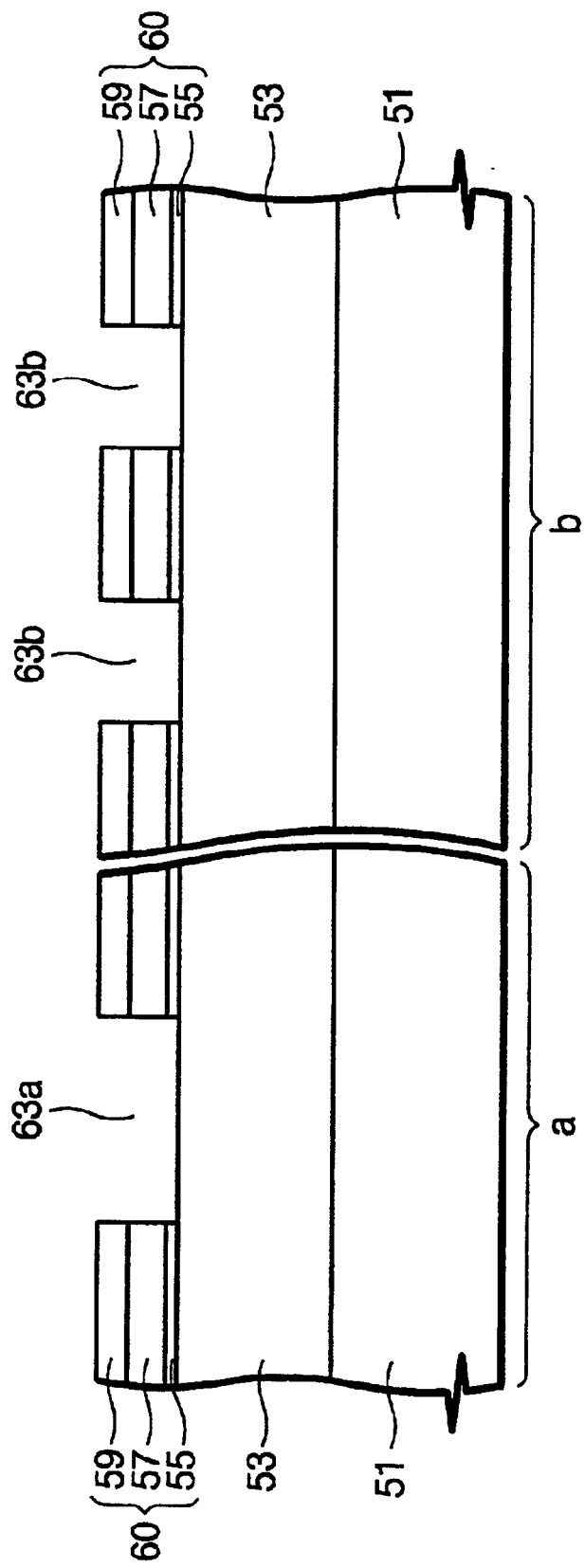
FIG. 3 to FIG. 6 are cross-sectional views illustrating the process steps of a method of fabricating the flip chip type semiconductor device shown in FIG. 2.

Referring to FIG. 3, an interlayer insulation layer 53 is formed on a surface of a semiconductor substrate 51. The interlayer insulation layer 53 is formed of a silicon oxide layer containing impurities, for example a boro-phospho silicate glass (BPSG) layer. The interlayer insulation layer 53 can be formed of an undoped silicon oxide layer. On the interlayer insulation layer 53, a passivation layer 60 is then formed. The passivation layer 60 is desirably formed by depositing a lower silicon nitride layer 55, an intermediate silicon oxide layer 57 and an upper silicon nitride layer 59 in order. Alternatively, the passivation layer 60 can be formed by depositing a lower silicon oxide layer 57 and an upper silicon nitride layer 59 in order. The passivation layer 60 is then patterned to form at least one first groove 63a and a plurality of, for example at least two, second grooves 63b in the pad and fuse areas a, b, respectively.

Figure 4:
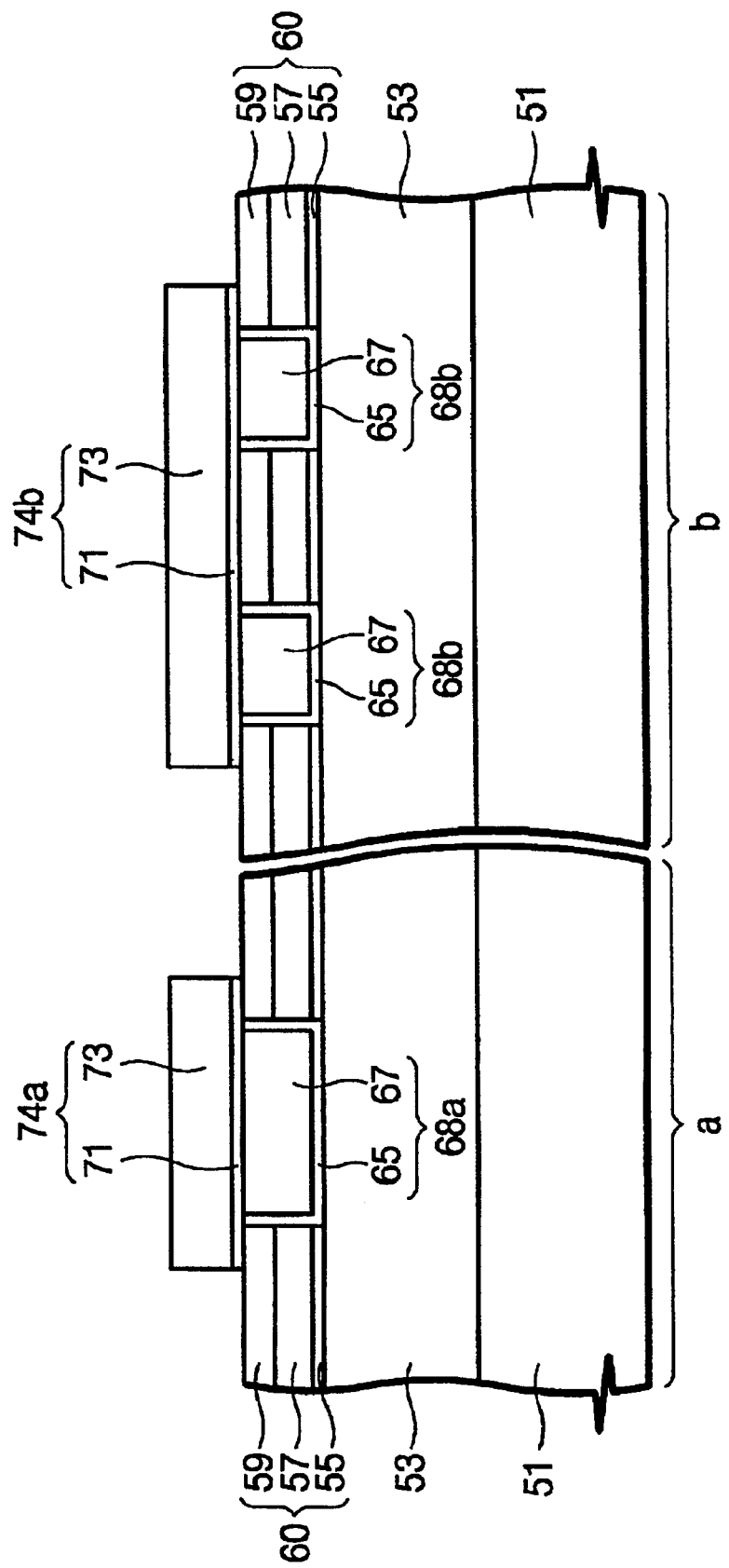

Referring to FIG. 4, first and second metal lines 68a, 68b are formed respectively in the first and second grooves 63a, 63b by means of a conventional damascene process. More specifically, a conformal diffusion barrier metal layer is formed over the whole surface of the substrate including the first and second grooves 63a, 63b and then a copper layer filling the first and second grooves 63a, 63b is formed on the diffusion barrier metal layer. The diffusion barrier metal layer is formed of a metal layer which can prevent copper elements in the copper layer from penetrating through the interlayer insulation layer 53 and the passivation layer 60. For example, the diffusion barrier metal layer is desirably formed of a tantalum nitride layer. The copper layer and the diffusion barrier metal layer are then continuously planarized until the upper silicon nitride layer 59 is exposed. As a result, the first and second metal lines 68a, 68b which comprise a copper layer pattern 67 and a diffusion barrier metal layer pattern 65 enclosing side walls and bottoms of the copper layer pattern 67 are formed in the first and second grooves 63a, 63b, respectively.

Next, over the whole surface of the substrate including the first and second lines 68a, 68b, a metal layer is formed. It is desirable that the metal layer be formed by depositing a barrier metal layer and an aluminum layer in order. The barrier metal layer is formed of the same material layer as the diffusion barrier metal layer, i.e., the tantalum nitride layer. The metal layer is then patterned to form a pad 74a and a fuse 74b in the pad and fuse areas a, b, respectively. The pad 74a covers a portion of the first metal line 68a, and the fuse 74b covers the pair of second metal lines 68b adjacent to each other, and a portion of the passivation layer 60 therebetween. Consequently, the fuse 74b electrically interconnects the pair of second metal lines 68b adjacent to each other. The pad 74a and the fuse 74b comprise a barrier metal layer pattern 71 and an aluminum layer pattern 73 which are deposited in order.

Figure 5:
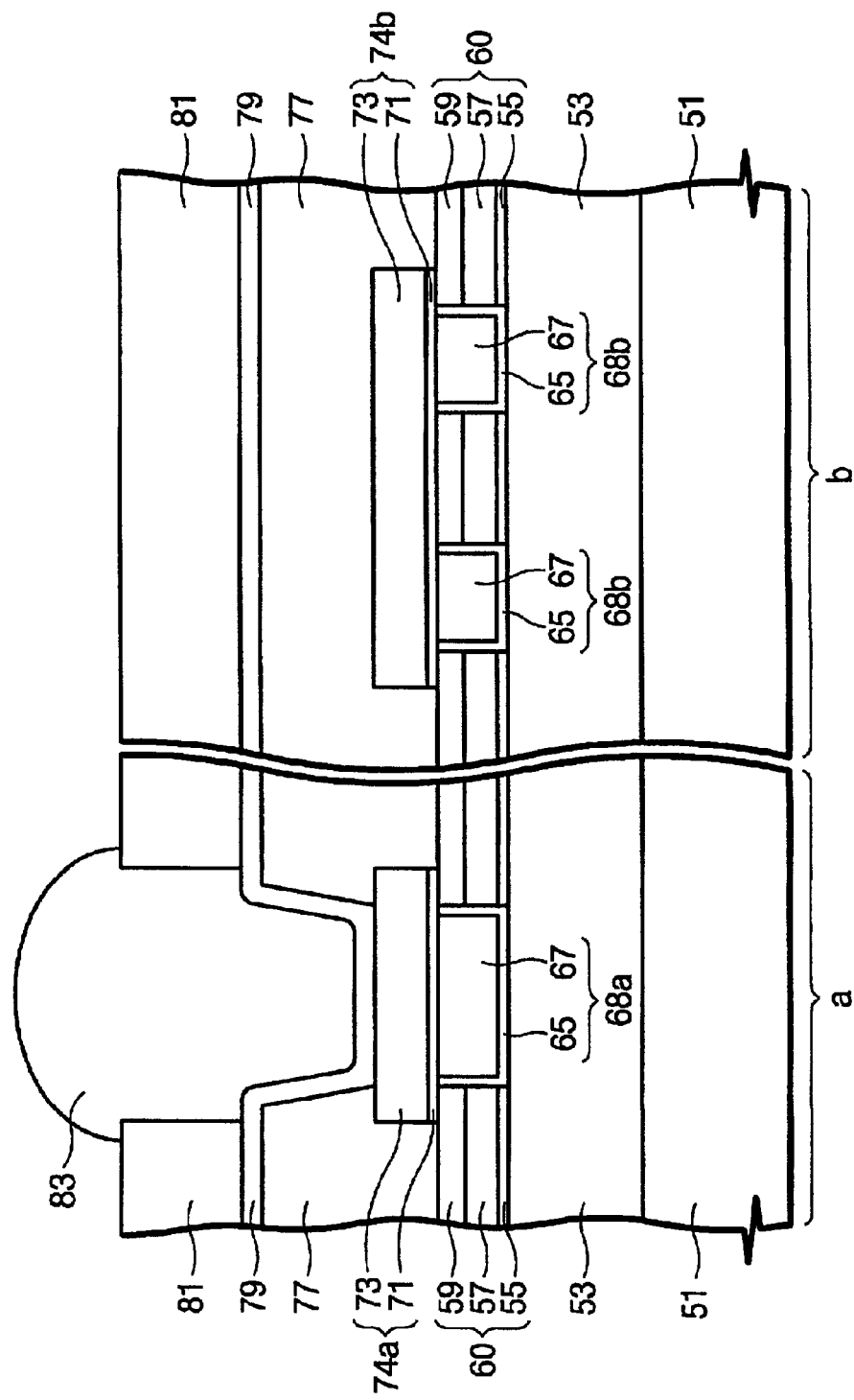

Referring to FIG. 5, a polyimide layer 77 is formed over the whole surface of the substrate including the pad 74a and the fuse 74b. The polyimide layer 77 functions to alleviate stress which will be imposed on the substrate from epoxy molding compound to be used in the subsequent package process. Also, the polyimide layer 77 acts to restrain alpha-particles from penetrating through integrated circuits (not shown) on the semiconductor substrate from the outside.

The polyimide layer 77 is then patterned to form a pad opening exposing the pad 74a.

Over the whole surface of the substrate including the pad opening, an under-bump metal layer 79 is formed. A photo-resist pattern 81 is then formed on the under-bump metal layer 79 to expose the under-bump metal layer 79 in the pad opening. On the exposed under-bump metal layer 79, a bump pattern 83 is formed by means of an electroplating method. The bump pattern 83 is formed of a layer of alloy of lead (Pb) and tin (Sn).

Figure 6:
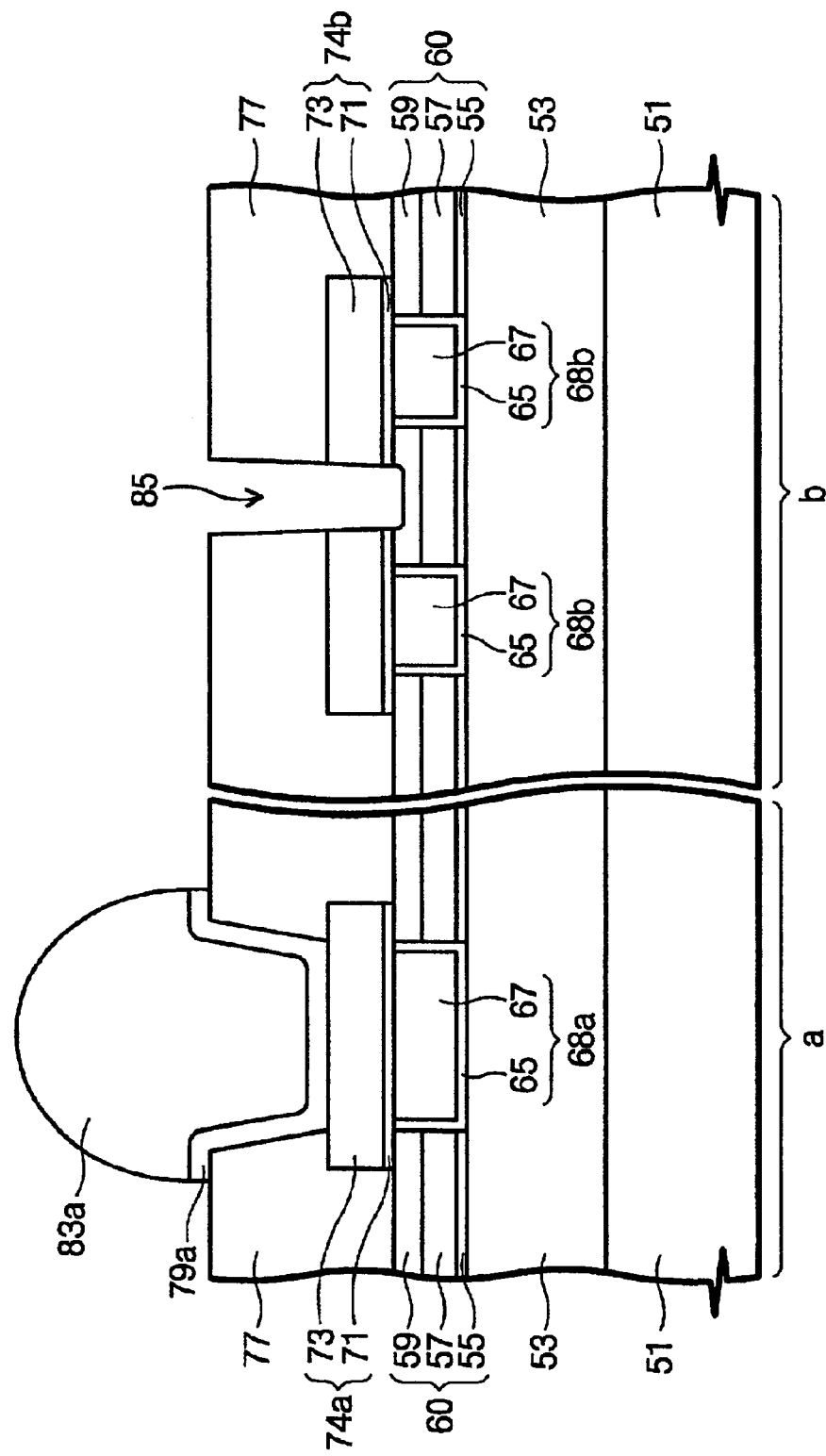

Referring to FIG. 6, the photo-resist pattern 81 is removed to expose the under-bump metal layer 79 thereunder. The exposed under-bump metal layer 79 is then removed by means of a wet etching process using the bump pattern 83 as a mask. Consequently, an under-bump metal layer pattern 79a is formed between the bump pattern 83 and the pad 74a. And then, a round shaped bump 83a is formed by reflowing the bump pattern 83 by means of a general heat treatment method. Continually, when a transistor or memory cell connected to the first or second metal lines 68a or 68b malfunctions, a repair process for cutting the fuse 74b is carried out. The repair process is carried out using a laser 85 or the like. The repair process can be carried out prior to formation of the under-bump metal layer 79.

As apparent from the foregoing description, the present invention can skip the process of patterning the passivation layer so as to expose the first metal line and the process of patterning the upper silicon nitride layer on the fuse carried out in the conventional method, thereby simplifying the back-end process. Also, the present invention can easily cut the fuse by using the laser in the repair process, since the pad and the fuse can be formed of the aluminum layer.

In the drawings and specification, there has been disclosed a typical preferred embodiment of the invention and, although specific terms are employed, they are used in a generic and descriptive sense only and not for purpose of limitation, the scope of the invention being set forth in the following claims.

What is claimed is:

1. A flip chip type semiconductor device having pad and fuse areas, comprising:
   an interlayer insulation layer formed on a semiconductor substrate;
   a passivation layer formed on said interlayer insulation layer;
   at least one first metal line formed in a given region of said passivation layer in said pad area;
   at least a pair of second metal lines formed in a given region of said passivation layer in said fuse area;
   a pad covering a portion of said first metal line;
   a fuse covering said pair of second metal lines and said passivation layer there between, said fuse being formed of a layer of the same material as said pad;
   a polyimide layer over the surface of said semiconductor substrate including said pad and said fuse, said polyimide layer being in contact with and surrounding side and top surfaces of said pad and said fuse, said polyimide layer having a pad opening that exposes said pad; and
   an under-bump metal layer pattern and a bump sequentially stacked on said exposed pad.

2. The device according to claim 1, wherein said passivation layer includes a lower silicon nitride layer, an intermediate silicon oxide layer, and an upper silicon nitride layer, which are stacked in order.

3. The device according to claim 1, wherein said first and second metal lines include a copper layer pattern and a diffusion barrier metal layer pattern enclosing side walls and bottoms of said copper layer pattern.

4. The device according to claim 3, wherein said diffusion barrier metal layer pattern is a tantalum nitride layer.

5. The device according to claim 1, wherein said pad and fuse include a barrier metal layer pattern and an aluminum layer pattern which are stacked in order.

* * * * *